(12) United States Patent
Nakano et al.

(10) Patent No.: US 8,051,522 B2
(45) Date of Patent: Nov. 8, 2011

(54) SUBSTRATE TREATMENT APPARATUS

(75) Inventors: Akiyoshi Nakano, Kyoto (JP); Koichi Mukaegaki, Kyoto (JP); Yoshikazu Kago, Kyoto (JP); Hiroyuki Ueno, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 809 days.

(21) Appl. No.: 12/109,059

(22) Filed: Apr. 24, 2008

(65) Prior Publication Data

US 2008/0263793 A1 Oct. 30, 2008

(30) Foreign Application Priority Data

Apr. 27, 2007 (JP) ................... 2007-120078

(51) Int. Cl.
*A47L 15/39* (2006.01)
(52) U.S. Cl. ............................. 15/77; 15/88.3
(58) Field of Classification Search .... 15/77, 88.1–88.3, 15/102, 82, 319, 339
See application file for complete search history.

(56) References Cited

U.S. PATENT DOCUMENTS

| | | | | |
|---|---|---|---|---|
| 2007/0006895 | A1* | 1/2007 | Iwami et al. | 134/6 |
| 2007/0226924 | A1* | 10/2007 | Hiraoka et al. | 15/102 |
| 2007/0226925 | A1* | 10/2007 | Hiraoka et al. | 15/102 |
| 2007/0226926 | A1* | 10/2007 | Hiraoka et al. | 15/102 |
| 2009/0050177 | A1 | 2/2009 | Nagayasu et al. | |

FOREIGN PATENT DOCUMENTS

| | | |
|---|---|---|
| JP | 8-206617 | 8/1996 |
| JP | 9-223682 | 8/1997 |
| JP | 10-229063 | 8/1998 |
| JP | 11-000625 | 1/1999 |
| JP | 11-260783 | 9/1999 |
| JP | 2002-313765 | 10/2002 |
| JP | 2003-197592 | 7/2003 |
| JP | 2005-317576 | 11/2005 |
| JP | 2006-278592 | 10/2006 |
| JP | 2007-19213 A | 1/2007 |
| JP | 2007-044693 A | 2/2007 |
| KR | 10-0175278 B1 | 4/1999 |
| KR | 10-2002-0006685 A | 1/2002 |

OTHER PUBLICATIONS

Korean Office Action (Notice of Allowance) dated Nov. 28, 2009 in corresponding Korean Patent Application No. 10-2008-0035969.

\* cited by examiner

*Primary Examiner* — Dung Van Nguyen
(74) *Attorney, Agent, or Firm* — Ostrolenk Faber LLP

(57) ABSTRACT

The present invention provides a substrate treatment apparatus for performing a substrate periphery cleaning process. The substrate treatment apparatus includes substrate holding mechanism which holds a substrate, a brush having a cleaning surface inclined with respect to a longitudinal axis thereof extending perpendicularly to a front surface of the substrate held by the substrate holding mechanism, brush moving mechanism which moves the brush along the longitudinal axis and along a lateral axis orthogonal to the longitudinal axis, load detecting unit which detects a load applied along the longitudinal axis to the brush, and first judging unit which judges, based on an output of the load detecting unit, whether or not the brush is located at a reference position serving as a reference for guiding the brush to a treatment position at which the brush is located in the cleaning process.

7 Claims, 11 Drawing Sheets

FIG. 5

| CLEANING WIDTH (mm) | DEPRESSION DEPTH (mm) | LOAD (mN) |
|---|---|---|
| 0.5 | 0.5 | 25 |
| 1.0 | 1.1 | 50 |
| 1.5 | 1.6 | 120 |
| 2.0 | 2.1 | 190 |
| 2.5 | 2.7 | 270 |
| 3.0 | 3.2 | 340 |
| 3.5 | 3.7 | 410 |
| 4.0 | 4.3 | 490 |
| 4.5 | 4.8 | 560 |
| 5.0 | 5.3 | 630 |

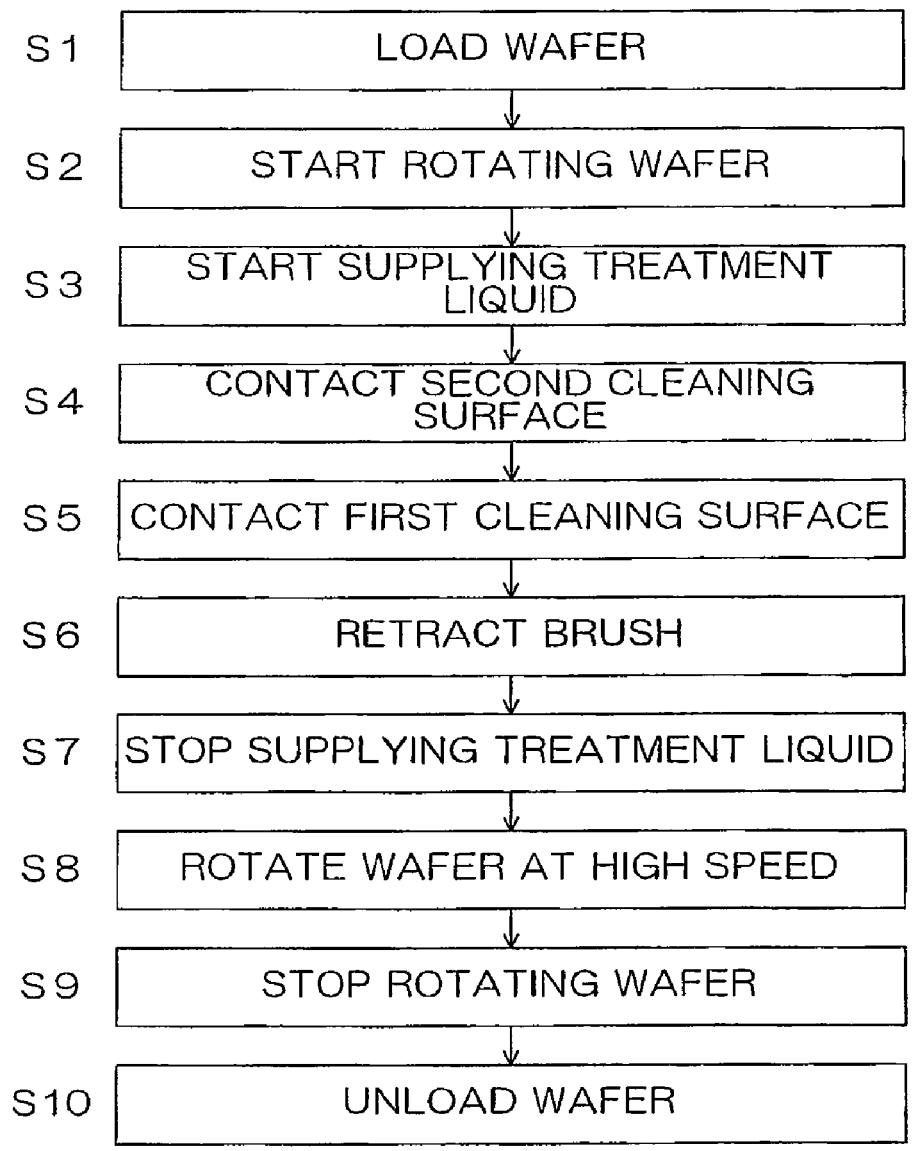

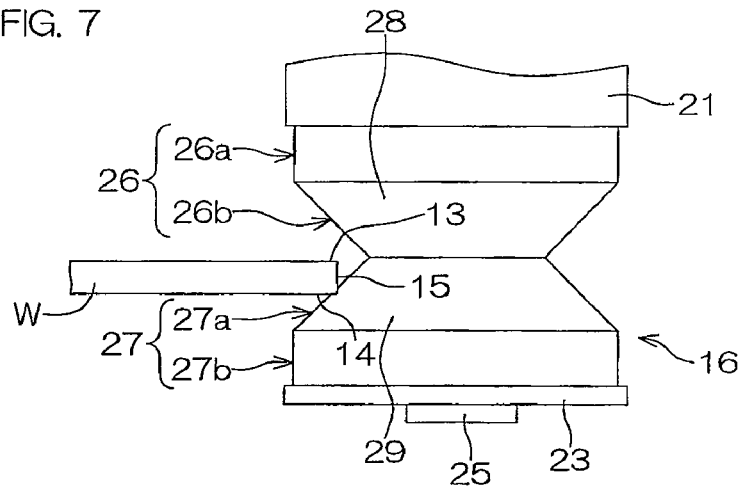
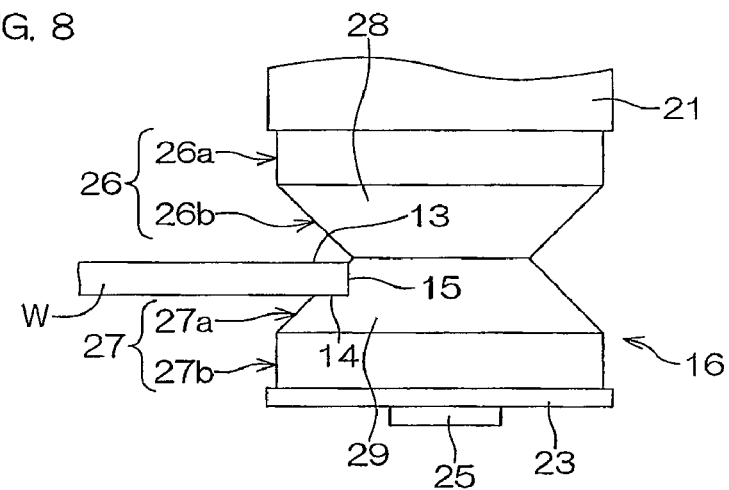
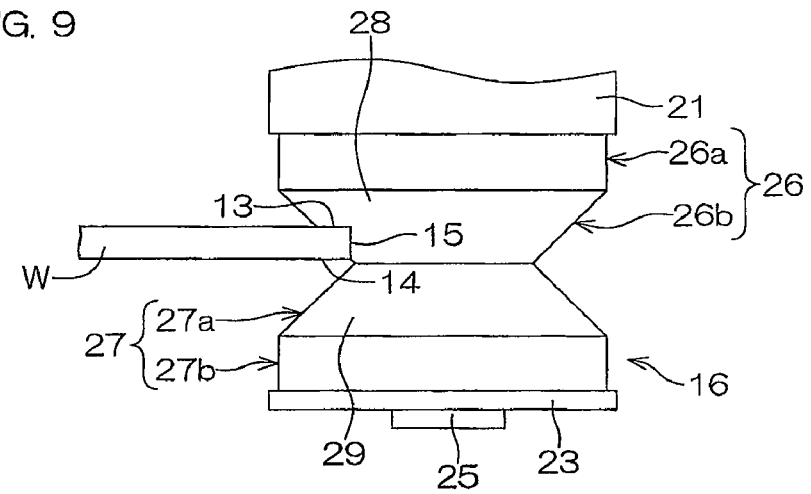

SUBSTRATE TREATMENT APPARATUS

BACKGROUND OF THE INVENTION

1. Field of the Invention

The present invention relates to a substrate treatment apparatus for performing a cleaning process to clean the periphery of a substrate. Examples of the substrate to be cleaned include semiconductor wafers, substrates for liquid crystal display devices, substrates for plasma display devices, substrates for FED (Field Emission Display) devices, substrates for optical disks, substrates for magnetic disks, substrates for magneto-optical disks and substrates for photo masks.

2. Description of Related Art

In semiconductor device production processes, contamination of the periphery of a semiconductor wafer often significantly influences the treatment quality of the semiconductor wafer. In a so-called batch treatment process, for example, a plurality of semiconductor wafers are immersed in a vertical orientation in a treatment liquid. Therefore, if contaminants are present on the peripheries of the semiconductor wafers, the contaminants float in the treatment liquid and adhere onto device formation regions of front surfaces of the semiconductor wafers, thereby contaminating the device formation regions.

This leads to a recent increasing demand for techniques for cleaning the peripheries of semiconductor wafers and other types of substrates.

Japanese Unexamined Patent Publication No. 2003-197592, for example, proposes a prior-art apparatus for cleaning the periphery of a substrate. The apparatus includes a turntable which holds and rotates the substrate, and a cylindrical brush for cleaning a peripheral surface of the substrate. Before the start of a cleaning process, the brush is located in a standby position apart from the turntable. Upon the start of the cleaning process, the brush is moved from the standby position into abutment against the peripheral surface of the substrate held on the turntable. Then, the turntable is rotated with the substrate held thereon and with a circumferential surface of the brush kept in abutment against the peripheral surface of the substrate. Thus, the peripheral surface of the substrate is kept in sliding contact with the brush, and thereby cleaned by the brush.

However, the proposed apparatus does not necessarily ensure that the brush is kept in abutment against the peripheral surface of the substrate during the cleaning process. If the brush happens to be offset from a normal position or detached from a brush holding member, the brush will be brought out of abutment against the peripheral surface of the substrate, making it impossible to properly clean the peripheral surface (periphery) of the substrate.

SUMMARY OF THE INVENTION

It is an object of the present invention to provide a substrate treatment apparatus which is capable of reliably cleaning the periphery of a substrate.

According to one aspect of the present invention, there is provided a substrate treatment apparatus for performing a substrate periphery cleaning process. The substrate treatment apparatus includes a substrate holding mechanism which holds a substrate, a brush having a cleaning surface inclined with respect to a first axis extending perpendicularly to a front surface of the substrate held by the substrate holding mechanism, a brush moving mechanism which moves the brush along the first axis and along a second axis orthogonal to the first axis, a load detecting unit which detects a load applied along the first axis to the brush, and a first judging unit which judges, based on an output of the load detecting unit, whether or not the brush is located at a reference position serving as a reference for guiding the brush to a treatment position at which the brush is located in the cleaning process.

With this arrangement, the cleaning surface of the brush is inclined with respect to the first axis extending perpendicularly to the front surface of the substrate held by the substrate holding mechanism. Therefore, when the cleaning surface contacts the peripheral surface and one of the front surface and a back surface of the substrate, the brush receives a counterforce from the front or back surface of the substrate due to the contact. Accordingly, the load applied along the first axis to the brush is changed by the contact. Therefore, the reference position is set such that the brush contacts the substrate held by the substrate holding mechanism when being located at the reference position. Thus, whether or not the brush is located at the reference position can be judged based on the output of the load detecting unit which detects the load applied along the first axis to the brush. This makes it possible to detect the contact of the brush with the periphery of the substrate.

Since the contact of the brush with the periphery of the substrate can be detected, the brush is reliably kept in contact with the periphery of the substrate and, in this state, the periphery of the substrate is cleaned by the brush. Thus, the substrate periphery cleaning process is reliably performed.

The reference position may be a position such that the cleaning surface is depressed to a predetermined depth by an edge defined by the peripheral surface and the front or back surface of the substrate held by the substrate holding mechanism when the brush is located at the reference position.

With the arrangement in which the reference position is set at the aforementioned position, the cleaning surface of the brush is depressed to the predetermined depth (preferably, a very small depth which permits stable and reliable detection of the load by the load detecting unit) by the edge defined by the peripheral surface and the front or back surface of the substrate, when the brush is located at the reference position. Thus, the load applied along the first axis to the brush is certainly changed. Therefore, whether or not the brush is located at the reference position can be properly judged based on the output of the load detecting unit.

The substrate treatment apparatus may further include an initial load applying mechanism which applies a predetermined initial load to the brush with the brush being in non-contact with the substrate held by the substrate holding mechanism. In this case, the first judging unit judges, on the basis of a change in the load detected by the load detecting unit from the initial load, whether or not the brush is located at the reference position.

Where the load detecting unit is configured to detect a load greater than a predetermined level when the load is applied to the brush, for example, the application of the initial load to the brush before the contact of the brush with the substrate permits the load detecting unit to detect a load change occurring due to the contact of the brush with the substrate immediately after the contact.

The substrate treatment apparatus preferably further includes second judging unit which judges whether or not the load detected by the load detecting unit is within a predetermined load range when the brush is located at the treatment position.

If the load detected by the load detecting unit is within the predetermined load range when the brush is located at the treatment position during the cleaning process, it is judged that the brush is kept in contact with the substrate with a proper biasing pressure. On the other, if the load detected by the load detecting unit is outside the predetermined load range, it is judged that the brush is not kept in contact with the substrate with the proper biasing pressure. If it is judged that the brush is not kept in contact with the substrate with the proper biasing pressure, an alarm is outputted to notify an operator of an improper brush contact state. Alternatively, the position of the brush may be corrected by feedback-controlling the brush moving mechanism so that the load detected by the load detecting unit falls within the predetermined load range.

The substrate treatment apparatus preferably further includes reference position setting unit which controls the brush moving mechanism to move the brush toward the substrate held by the substrate holding mechanism while monitoring the output of the load detecting unit, and sets the reference position at a position at which the brush is present when the load detected by the load detecting unit exceeds a predetermined threshold due to the contact of the brush with the substrate.

In order to move the brush to the treatment position, the reference position serving as the reference for the movement is preliminarily taught to a control section which controls the brush moving mechanism. It is a conventional practice that the operator manually performs a teaching process. That is, the operator visually checks if the brush contacts the peripheral surface of the substrate, while gradually moving the brush. Then, a position at which the brush is present when the operator confirms the contact of the brush with the peripheral surface of the substrate is inputted to the control section, and employed as the reference position for guiding the brush to the treatment position. However, the reference position thus set by the conventional teaching process varies depending on the experience and expertise of the operator, and the treatment position is correspondingly offset.

According to the present invention, on the contrary, the brush is moved toward the substrate (a substrate to be treated or a dummy substrate) held by the substrate holding mechanism, and the reference position is set at the position at which the brush is present when the load detected by the load detecting unit exceeds the predetermined threshold due to the contact of the brush with the periphery of the substrate. Thus, the reference position can be set at such a unique position irrespective of the experience and expertise of the operator unlike in the conventional reference position setting method.

The substrate treatment apparatus preferably further includes a load storage which stores a load applied along the first axis to the brush when the brush is located at the treatment position, and storage controlling unit which controls the brush moving mechanism to move the brush from the reference position to the treatment position and stores a load detected by the load detecting unit when the brush is located at the treatment position in correlation with a distance between the reference position and the treatment position in the load storage.

With this arrangement, the load applied to the brush when the brush is located at the treatment position is detected, and the detected load is automatically stored in the load storage in correlation with the distance between the reference position and the treatment position (depression depth). Therefore, where the correlation between the load and the distance between the reference position and the treatment position is required for the control, e.g., where the substrate treatment apparatus includes the second judging means, the operator is saved from having to manually input the correlation.

The treatment position may include a plurality of treatment positions which are spaced different distances from the reference position. In this case, the substrate treatment apparatus preferably further includes a contact width storage which stores contact widths of the brush with respect to the front surface of the substrate observed when the brush is located at the respective treatment positions in correlation with distances between the reference position and the treatment positions (depression depths).

With the provision of the contact width storage, when the contact width of the brush with respect to the front surface of the substrate is inputted into a recipe (which specifies various conditions for the cleaning process) by the operator, the control section which controls the brush moving mechanism automatically acquires a depression depth for the contact width, and controls the brush moving mechanism based on the acquired depression depth. As a result, the brush is kept in contact with an area of the front surface of the substrate having a width equivalent to the contact width inputted by the operator.

The cleaning surface preferably has a shape rotationally symmetrical about a center axis extending along the first axis.

Since the shape of the cleaning surface is rotationally symmetrical about the center axis extending along the first axis, the brush is rotatable about the center axis with the cleaning surface thereof in contact with the periphery of the substrate. The peripheral surface of the substrate can be scrubbed by rotating the brush. As a result, the substrate periphery cleaning process is further advantageously performed.

The cleaning surface preferably includes a first portion having a shape tapered in one direction along the first axis toward one edge thereof, and a second portion having a shape flared from the one edge of the first portion in the one direction along the first axis. That is, the first portion and the second portion are tapered toward each other along the first axis).

With the arrangement in which the cleaning surface has the first portion and the second portion, the first portion is brought into contact with the peripheral surface and a peripheral edge portion of the front surface of the substrate, and the second portion is brought into contact with the peripheral surface and a peripheral edge portion of the back surface of the substrate. Thus, the peripheral surface and the peripheral edge portions of the front and back surfaces of the substrate can be cleaned.

The foregoing and other objects, features and effects of the present invention will become more apparent from the following detailed description of preferred embodiments with reference to the attached drawings.

BRIEF DESCRIPTION OF THE DRAWINGS

FIG. 5 is a diagram showing an exemplary cleaning width/depression depth/load table.

FIG. 6 is a process diagram for explaining a wafer periphery cleaning process to be performed by the substrate treatment apparatus.

FIG. 7 is a side view showing the state of the brush at a reference position.

FIG. 8 is a side view showing the state of the brush observed during a back side cleaning operation.

FIG. 9 is a side view showing the state of the brush observed during a front side cleaning operation.

DETAILED DESCRIPTION OF PREFERRED EMBODIMENTS

Embodiments of the present invention will hereinafter be described in detail with reference to the attached drawings.

Figure 1:
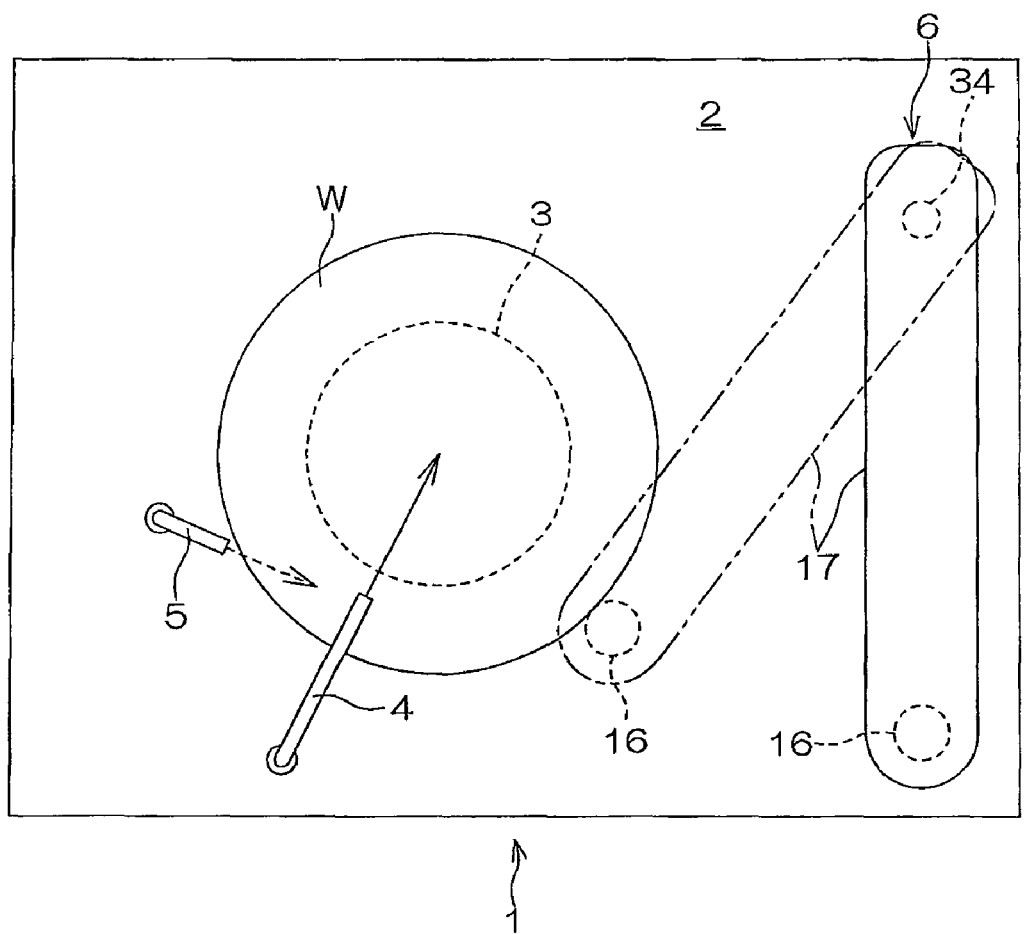
FIG. 1 is a plan view schematically showing the construction of a substrate treatment apparatus according to one embodiment of the present invention.

FIG. 1 is a plan view schematically showing the construction of a substrate treatment apparatus according to one embodiment of the present invention.

Figure 2:
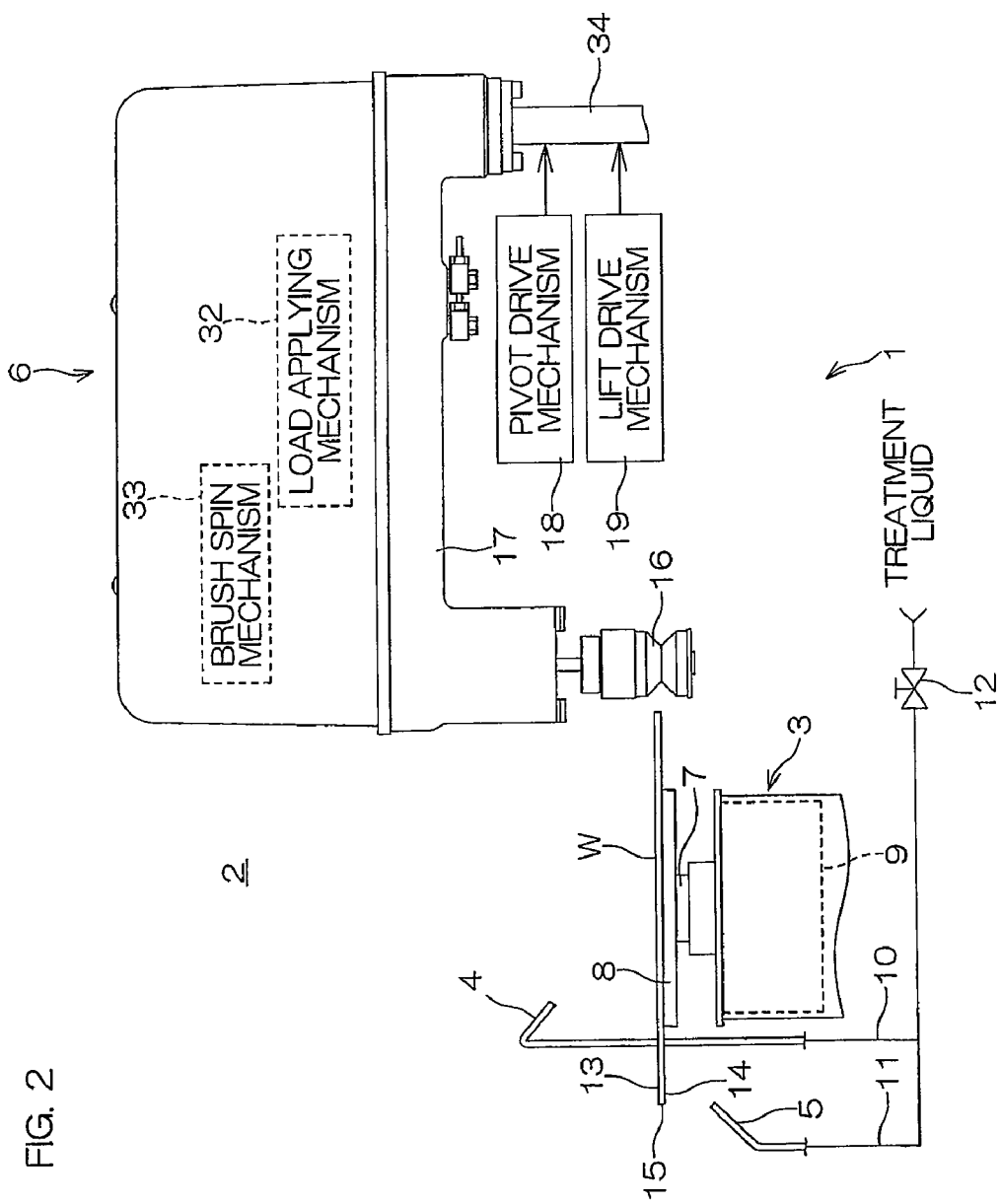
FIG. 2 is a side view schematically illustrating the inside of the substrate treatment apparatus.

FIG. 2 is a side view schematically illustrating the inside of the substrate treatment apparatus shown in FIG. 1.

The substrate treatment apparatus 1 is of a single substrate treatment type which is adapted to treat a single semiconductor wafer (an example of a substrate hereinafter referred to simply as "wafer") W at a time. The substrate treatment apparatus 1 includes a spin chuck 3 which generally horizontally holds and rotates the wafer W, a front side nozzle 4 which supplies a treatment liquid to a front surface (in which devices are formed) of the wafer W, a back side nozzle 5 which supplies a treatment liquid to a back surface of the wafer W, and a brush mechanism 6 which cleans a periphery of the wafer W. The spin chuck 3, the front side nozzle 4, the back side nozzle 5 and the brush mechanism 6 are provided in a treatment chamber 2 defined by partition walls.

The periphery of the wafer W herein means a portion of the wafer W including peripheral edge portions 13, 14 of the front and back surfaces of the wafer W (e.g., annular regions each having a width of 0.5 to 5 mm as measured from a peripheral edge of the wafer W), and a peripheral surface 15 of the wafer W.

The spin chuck 3 is a vacuum suction chuck. The spin chuck 3 includes a spin shaft 7 extending generally vertically, a suction base 8 provided on an upper end of the spin shaft 7 for generally horizontally holding the wafer W by sucking the back surface (lower surface) of the wafer W, and a spin motor 9 having a rotation shaft coupled coaxially with the spin shaft 7. When the spin motor 9 is driven with the back surface of the wafer W being sucked to be held on the suction base 8, the wafer W is rotated about a center axis of the spin shaft 7.

The front side nozzle 4 is connected to a treatment liquid supply pipe 10. The back side nozzle 5 is connected to a treatment liquid supply pipe 11. The treatment liquid is supplied to these treatment liquid supply pipes 10, 11 from a treatment liquid supply source not shown via a treatment liquid valve 12. The front side nozzle 4 spouts the treatment liquid supplied through the treatment liquid supply pipe 10 toward the center of the front surface of the wafer W held by the spin chuck 3. The back side nozzle 5 spouts the treatment liquid supplied through the treatment liquid supply pipe 11 toward a boundary between the suction base 8 and the peripheral edge portion of the back surface of the wafer W held by the spin chuck 3.

Pure water is used as the treatment liquid. Other examples of the treatment liquid include functional water such as carbonated water, ion water, ozone water, reductive water (hydrogen water) and magnetic water. Further, a chemical agent such as ammonia water or a mixture of ammonia water and hydrogen peroxide water may be used as the treatment liquid.

The brush mechanism 6 includes a brush 16, a pivot arm 17 holding the brush 16 at its distal end, a pivot drive mechanism 18 which horizontally pivots the pivot arm 17 about a vertical axis defined outside a wafer rotation region, and a lift drive mechanism 19 which moves up and down the pivot arm 17.

Figure 3:
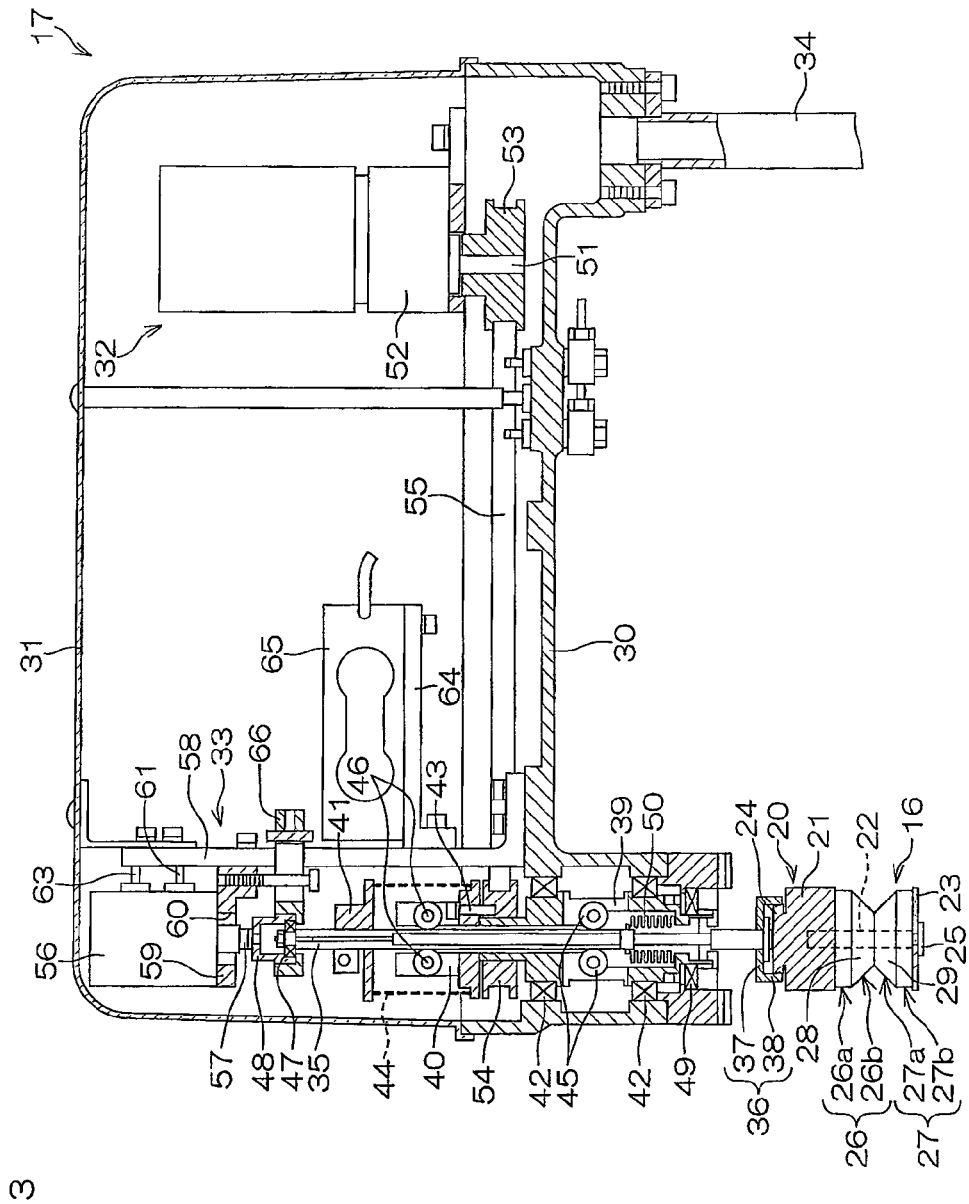
FIG. 3 is a sectional view showing the constructions of a brush and a pivot arm.

FIG. 3 is a sectional view showing the constructions of the brush 16 and the pivot arm 17.

The brush 16 is held by a brush holder 20. The brush holder 20 is attached to a holder attachment 36 to be described later. The brush holder 20 includes a generally cylindrical resin block 21, a core 22 disposed along a center axis of the resin block 21 and having an upper end portion inserted to be fixed in a lower surface of the resin block 21, and a plate 23 attached to a lower end of the core 22. A thread portion 24 having a threaded circumferential surface is integrally provided on an upper surface of the resin block 21. The core 22 has a screw hole provided in a lower end portion thereof. A bolt 25 is screwed into the screw hole as extending through a center portion of the plate 23, whereby the plate 23 is removably attached to the core 22.

The brush 16 is fitted around the core 22 to be held between the resin block 21 and the plate 23. The brush 16 is made of PVA (polyvinyl alcohol). The brush 16 includes a first cleaning portion 26 for cleaning the peripheral surface 15 and the peripheral edge portion 13 of the front surface of the wafer W, and a second cleaning portion 27 for cleaning the peripheral surface 15 and the peripheral edge portion 14 of the back surface of the wafer W. The first cleaning portion 26 and the second cleaning portion 27 are integrally provided in vertically stacked relation, and the entire brush 16 has a generally hourglass shape which is rotationally symmetrical about a vertical axis thereof.

The first cleaning portion 26 includes an upper portion 26a having a generally cylindrical shape, and a lower portion 26b having a generally truncated cone shape tapered downward. A side surface of the lower portion 26b has an upper edge continuous to a lower edge of a side surface of the upper portion 26a, and is inclined downward toward the center axis at an inclination angle of 45 degrees with respect to its center axis. The side surface of the lower portion 26b serves as a first cleaning surface 28 which is brought into contact with the peripheral surface 15 and the peripheral edge portion 13 of the front surface of the wafer W.

The second cleaning portion 27 is connected to a lower end of the first cleaning portion 26 to be combined with the first cleaning portion 26 as sharing the center axis with the first cleaning portion 26. The second cleaning portion 27 includes an upper portion 27a having a generally truncated cone shape expanded downward, and a lower portion 27b having a generally cylindrical shape. A side surface of the upper portion 27a has an upper edge continuous to a lower edge of the side surface of the lower portion 26b of the first cleaning portion 26, and is inclined downward away from the center axis at an inclination angle of 45 degrees with respect to its center axis. Further, the side surface of the upper portion 27a has a lower edge continuous to an upper edge of a side surface of the lower portion 27b. The side surface of the upper portion 27a serves as a second cleaning surface 29 which is brought into contact with the peripheral surface 15 and the peripheral edge portion 14 of the back surface of the wafer W.

The pivot arm 17 includes a lower casing 30, an upper casing 31 engaged with the lower casing 30, a brush spin mechanism 32 provided in an inner space defined by the lower casing 30 and the upper casing 31 for rotating (spinning) the brush 16 about the vertical axis, and a load applying mechanism 33 provided in the inner space defined by the lower casing 30 and the upper casing 31 for applying a vertically downward load to the brush 16.

The lower casing 30 has one end portion (proximal end portion) connected to an upper end of an arm support shaft 34 extending vertically. A driving force from the pivot drive mechanism 18 (see FIG. 2) is inputted to the arm support shaft 34. The arm support shaft 34 is rotated back and forth by thus inputting the driving force from the pivot drive mechanism 18 to the arm support shaft 34, whereby the pivot arm 17 is pivoted about the arm support shaft 34. The lift drive mechanism 19 (see FIG. 2) is connected to the arm support shaft 34. The arm support shaft 34 is moved up and down by the lift drive mechanism 19, whereby the pivot arm 17 is moved up and down together with the arm support shaft 34.

A spin shaft 35 is provided in the other end portion (free end portion) of the lower casing 30 as extending vertically in a rotatable and vertically movable manner. The spin shaft 35 has a lower end portion projecting downward from the other end portion of the lower casing 30, and an upper end portion extending to a vertically middle portion of the upper casing 31.

The holder attachment 36 to which the brush holder 20 is attached is fixed around the lower end portion of the spin shaft 35 projecting from the lower casing 30. The spin shaft 35 is inserted through the holder attachment 36. The holder attachment 36 integrally includes a disk-shaped top face portion 37 fixed to the spin shaft 35, and a cylindrical sidewall portion 38 extending downward from a peripheral edge of the top face portion 37. The sidewall portion 38 has a threaded inner peripheral surface. The threaded inner peripheral surface is threadingly engaged with the threaded circumferential surface of the thread portion 24 of the brush holder 20, whereby the brush holder 20 is attached to the holder attachment 36.

A lower guide roller support member 39, an upper guide roller support member 40 and a spring fixing member 41 are fitted around the spin shaft 35.

The lower guide roller support member 39 is provided around the spin shaft 35 in noncontact with the spin shaft 35 as being spaced a very small distance from a peripheral surface of the spin shaft 35. The lower guide roller support member 39 has a shape rotationally symmetrical about the center axis of the spin shaft 35. The lower guide roller support member 39 is rotatably supported by the other end portion of the lower casing 30 via two bearings 42 disposed in spaced relation. The lower guide roller support member 39 has a cylindrical upper end portion having a smaller diameter than a lower portion thereof. A pulley 54 (to be described later) of the brush spin mechanism 32 is nonrotatably fitted around the cylindrical upper end portion.

The upper guide roller support member 40 is provided above the lower guide roller support member 39. The upper guide roller support member 40 is provided around the spin shaft 35 in noncontact with the spin shaft 35 as being spaced a very small distance from the peripheral surface of the spin shaft 35. The upper guide roller support member 40 is connected to the pulley 54 by a bolt 43.

The spring fixing member 41 is fixed to the spin shaft 35 above the upper guide roller support member 40 in spaced relation from the upper guide roller support member 40. One end (upper end) of a coil spring 44 is fixed to the spring fixing member 41. The coil spring 44 is provided between the spring fixing member 41 and the upper guide roller support member 40. The other end (lower end) of the coil spring 44 is fixed to the upper guide roller support member 40.

The lower guide roller support member 39 supports a pair of guide rollers 45, while the upper guide roller support member 40 supports a pair of guide rollers 46. The guide rollers 45, 46 are each provided rotatably about a shaft extending perpendicularly to the spin shaft 35, and each have a circumferential surface kept in contact with the peripheral surface of the spin shaft 35. Thus, the vertical movement of the spin shaft 35 is guided by the guide rollers 45, 46. As a result, a resistance occurring due to the vertical movement of the spin shaft 35 is reduced.

On the other hand, a bearing 47 is fitted around the upper end portion of the spin shaft 35. A cap-shaped abutment member 48 is provided rotatably relative to the spin shaft 35 via the bearing 47.

A space defined between an outer peripheral surface of the lower guide roller support member 39 and the lower casing 30 is sealed with a magnetic fluid seal 49. Further, a space defined between an inner peripheral surface of the lower guide roller support member 39 and the spin shaft 35 is sealed with a bellows 50. Thus, an atmosphere containing the treatment liquid and a cleaning liquid in the treatment chamber 2 is prevented from intruding into the inner space defined by the lower casing 30 and the upper casing 31. Further, dust generated in the inner space is prevented from diffusing into the treatment chamber 2.

The brush spin mechanism 32 includes a brush motor 52, a pulley 53 fixed to an output shaft 51 of the brush motor 52, the pulley 54 fitted around the lower guide roller support member 39, and a belt 55 entrained between the pulleys 53 and 54. The brush motor 52 is provided adjacent the proximal end portion of the upper casing 31 with its output shaft 51 extending vertically.

When the brush motor 52 is driven, a rotation force of the brush motor 52 is transmitted to the pulley 54 via the pulley 53 and the belt 55. Thus, the lower guide roller support member 39 and the upper guide roller support member 40 are rotated together with the pulley 54. As the upper guide roller support member 40 is rotated, the coil spring 44 and the spring fixing member 41 are rotated. As a result, the spin shaft 35 is rotated, whereby the brush 16 attached to the lower end of the spin shaft 35 is rotated.

The load applying mechanism 33 includes an air cylinder 56. The air cylinder 56 is disposed above the abutment member 48 with its rod 57 directing downward. The rod 57 of the air cylinder 56 is vertically movable back and forth.

An L-shaped support plate 58 as seen from a lateral side extends upward from a bottom surface of the lower casing 30. A cylinder mount plate 59 is supported by the support plate 58. The cylinder mount plate 59 extends from the support plate 58 to above the abutment member 48. The cylinder mount plate 59 has a rod insertion hole 60 through which the rod 57 is inserted. The air cylinder 56 has a main body fixed to an upper surface of the cylinder mount plate 59 with the rod 57 being inserted through the rod insertion hole 60. A lower end of the rod 57 inserted through the rod insertion hole 60 abuts against the abutment member 48.

The inside of the main body of the air cylinder 56 is divided into two spaces arranged in a rod movement direction (vertically in tandem) by a piston (not shown) fixed to a proximal end of the rod 57. A first air supply pipe 61 provided with a continuous flow valve (not shown) is connected to one of the spaces present on one side of the piston adjacent to the rod 57 in the main body of the air cylinder 56. On the other hand, a second air supply pipe 63 is connected to the other space present on the other side of the piston opposite from the rod 57 in the main body.

When the opening degree of a cylinder valve 62 (see FIG. 4) is increased, the pressure of air supplied into the main body of the air cylinder 56 from the second air supply pipe 63 is increased to advance the rod 57 from the main body of the air cylinder 56. Conversely, when the opening degree of the cylinder valve 62 is reduced, the pressure of the air supplied into the main body of the air cylinder 56 from the second air supply pipe 63 is reduced, whereby the rod 57 is retracted into the main body of the air cylinder 56 due to the pressure of air supplied into the main body from the first air supply pipe 61 and the biasing force of the coil spring 44.

Further, the support plate 58 supports a sensor mount plate 64 extending away from the cylinder mount plate 59. A pressure sensor 65 of strain gage type is mounted on an upper surface of the sensor mount plate 64.

On the other hand, a load detection arm 66 is fixed to the abutment member 48. The load detection arm 66 extends from the abutment member 48 to above the pressure sensor 65. When a load greater than a predetermined level is applied downward to the rod 57 by the pressure of the air supplied into the main body of the air cylinder 56 from the second air supply pipe 63 (when the rod 57 advances greater than a predetermined distance from the air cylinder 56), the load detection arm 66 is pressed against the pressure sensor 65 with a pressure corresponding to the load applied to the rod 57. Thus, the pressure sensor 65 detects the load vertically applied to the brush 16 from the air cylinder 56 via the spin shaft 35 and the like.

Figure 4:
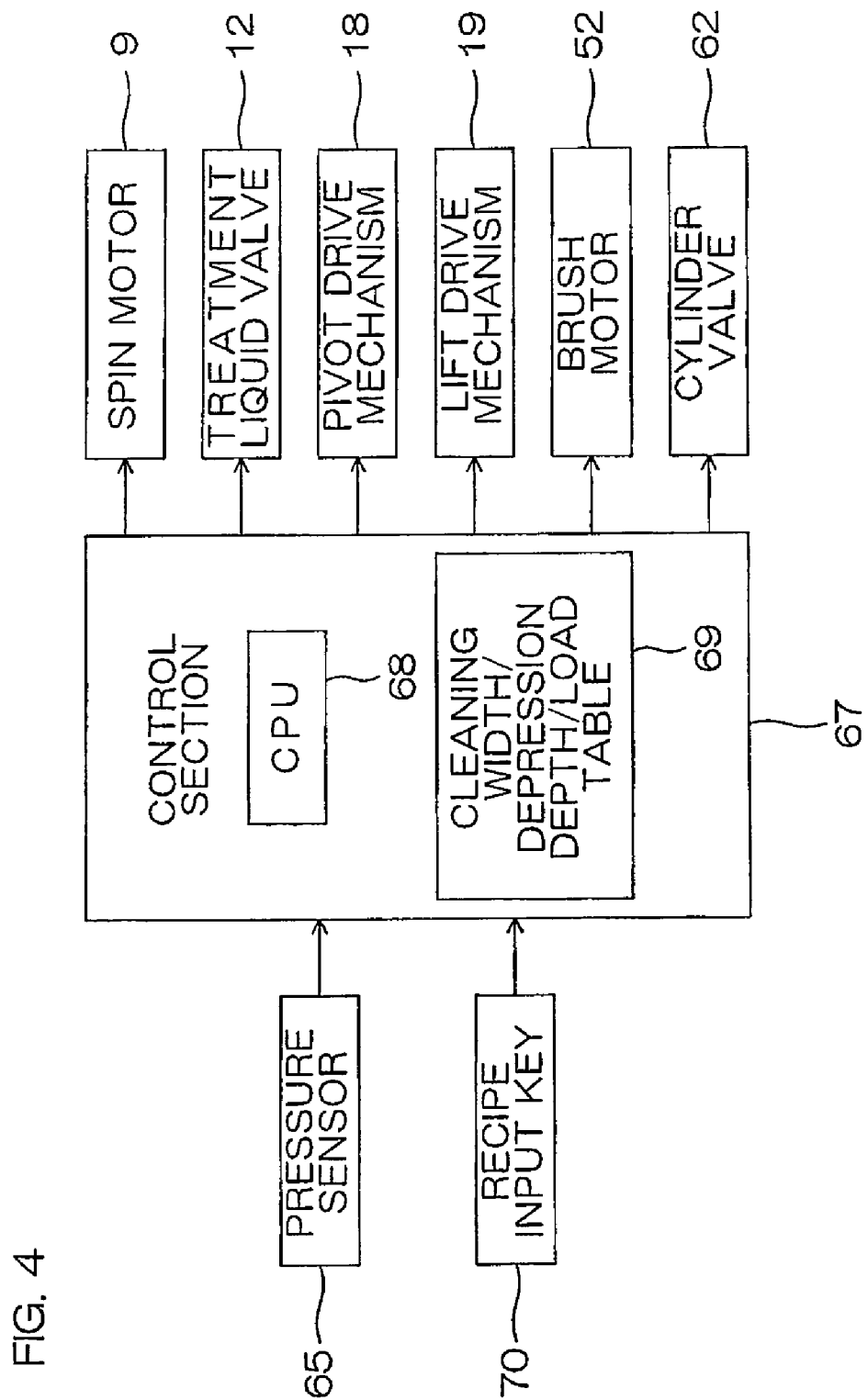
FIG. 4 is a block diagram showing the electrical construction of the substrate treatment apparatus.

FIG. 4 is a block diagram showing the electrical construction of the substrate treatment apparatus 1.

The substrate treatment apparatus 1 includes a control section 67 including, for example, a microcomputer. The microcomputer includes a CPU 68 and a memory 69. A cleaning width/depression depth/load table to be described later is stored in the memory 69.

A detection signal of the pressure sensor 65 is inputted to the control section 67. Further, a recipe input key 70 for inputting a recipe (which specifies various conditions for treatment of the wafer W) is connected to the control section 67. The spin motor 9, the treatment liquid valve 12, the pivot drive mechanism 18, the lift drive mechanism 19, the brush motor 52, the cylinder valve 62 and the like are connected as control objects to the control section 67.

FIG. 5 is a diagram showing one example of the cleaning width/depression depth/load table stored in the memory 69.

The cleaning width/depression depth/load table is prepared at each treatment position by correlating the width (cleaning width) of an area of the peripheral edge portion 14 of the back surface of the wafer W to be cleaned by the brush 16, a depth to which the brush 16 is depressed by the wafer W when the brush 16 is moved to the treatment position from a reference position, and a difference between a load (initial load to be described later) applied to the brush 16 when the brush 16 is in noncontact with the wafer W and a load applied to the brush 16 when the brush 16 is located at the treatment position (hereinafter referred to simply as "load change").

The treatment position is herein defined as a position at which the brush 16 is located during a cleaning process. The reference position is herein defined as a position which serves as a reference for guiding the brush 16 to the treatment position (at which the brush 16 is located during a back side cleaning operation). The reference position is set at a position such that the second cleaning surface 29 is depressed to a predetermined very small depth (preferably, a very small depression depth such that the pressure sensor 65 can stably detect the load) by an edge defined by the peripheral surface 15 and the back surface of the wafer W held by the spin chuck 3 when the brush 16 is located at the reference position. Therefore, the depth of the depression of the second cleaning surface 29 by the wafer W is substantially equivalent to a horizontal distance between the reference position and the treatment position, i.e., the distance of the horizontal movement of the brush 16 from the reference position to the treatment position.

The second cleaning surface 29 is inclined downward away from the center axis at an inclination angle of 45 degrees with respect to a vertical axis (perpendicular to the front surface of the wafer W held by the spin chuck 3). Therefore, when the second cleaning surface 29 is depressed by the wafer W, the brush 16 receives a vertical counterforce from the back surface of the wafer W. The counterforce is increased with the depth of the depression of the second cleaning surface 29 by the wafer W. Therefore, the load change is increased with the depth of the depression of the second cleaning surface 29 by the wafer W as shown in the cleaning width/depression depth/load table.

The cleaning width of the peripheral edge portion 14 of the back surface of the wafer W is equivalent to the width (contact width) of an area of the peripheral edge portion 14 of the back surface of the wafer W in contact with the second cleaning surface 29 as measured radially of the wafer W. Therefore, the cleaning width of the peripheral edge portion 14 of the back surface of the wafer W (the contact width of the peripheral edge portion 14 of the back surface of the wafer W) is increased with the depth of the depression of the second cleaning surface 29 by the wafer W as shown in the cleaning width/depression depth/load table.

When the brush 16 is located at the treatment position and, in this state, the lift drive mechanism 19 is controlled to move up the brush 16 by a predetermined distance (which is twice a vertical distance between the center of the wafer W and the treatment position), an edge defined by the front surface and the peripheral surface 15 of the wafer W depresses the first cleaning surface 28 to a depth equivalent to the depth of the depression of the second cleaning surface 29 by the wafer W. As a result, the first cleaning surface 28 contacts an area of the peripheral edge portion 13 of the front surface of the wafer W having a width equivalent to the contact width of the peripheral edge portion 14 of the back surface of the wafer W. Therefore, the cleaning width of the peripheral edge portion 14 of the back surface of the wafer W and the cleaning width of the peripheral edge portion 13 of the front surface of the wafer W are equal to each other in the cleaning width/depression depth/load table, and can be regarded as equivalent to each other. Further, a load change observed at this time and the load change observed when the second cleaning surface 29 is depressed by the wafer W are equal to each other, and can be regarded as equivalent to each other.

It is noted that the table shown in FIG. 5 is prepared by measuring the cleaning width and the load change for each depression width while rotating the wafer W at a rotation speed of 100 rpm and rotating the brush 16 at a rotation speed of 75 rpm.

FIG. 6 is a process diagram for explaining the cleaning process to be performed by the substrate treatment apparatus 1 for cleaning the periphery of the wafer W. FIGS. 7, 8 and 9 are side views showing the state of the brush 16 during the cleaning of the wafer W.

The wafer W to be cleaned is transported into the treatment chamber 2, and held by the spin chuck 3 (Step S1). After the wafer W is held by the spin chuck 3, the control section 67 (CPU 68) controls the spin motor 9, whereby the spin chuck 3 starts rotating the wafer W (Step S2). Thereafter, the control section 67 opens the treatment liquid valve 12, and starts supplying the treatment liquid to the front and back surfaces of the wafer W from the front side nozzle 4 and the back side nozzle 5, respectively (Step S3).

On the other hand, the control section 67 controls the opening degree of the cylinder valve 62 to cause the air cylinder 56 to apply the predetermined initial load (e.g., 800 mN) to the brush 16. By thus applying the initial load to the brush 16, the load detection arm 66 (see FIG. 3) is brought into contact with the pressure sensor 65. Therefore, the pressure sensor 65 is thereafter capable of detecting the load vertically applied to the brush 16. Then, the control section 67 controls the brush motor 52 to rotate the brush 16 in the same direction as the rotation direction of the wafer W. Thereafter, the control section 67 controls the pivot drive mechanism 18 and the lift drive mechanism 19 to move the brush 16 to the reference position. With the brush 16 being located at the reference position, the second cleaning surface 29 of the brush 16 is depressed to the predetermined very small depth by the edge defined by the back surface and the peripheral surface 15 of the wafer W held by the spin chuck 3.

Then, the control section 67 controls the pivot drive mechanism 18 to move the brush 16 from the reference position to the treatment position. The operator preliminarily inputs the cleaning width of the peripheral edge portion 13 of the front surface of the wafer W to the control section 67 by operating the recipe input key 70. The control section 67 reads out a depression depth for the inputted cleaning width from the cleaning width/depression depth/load table. Then, the brush 16 is moved for a distance corresponding to the read depression depth from the reference position. Where 2.0 mm is inputted as a desired cleaning width, for example, a depression depth of 2.1 mm corresponding to the inputted cleaning width is read out of the cleaning width/depression depth/load table, and the brush 16 is moved 2.1 mm toward the center of the wafer W from the reference position. Thus, the brush 16 is located at the treatment position, and the second cleaning surface 29 is brought into contact with the peripheral surface 15 and the peripheral edge portion 14 of the back surface of the wafer W as shown in FIG. 8 (Step S4). At this time, an area of the peripheral edge portion 14 of the back surface of the wafer W kept in contact with the second cleaning surface 29 has a width which is equal to the cleaning width inputted from the recipe input key 70.

In this state, the wafer W and the brush 16 are rotated in the same direction, whereby the second cleaning surface 29 is kept in sliding contact with the peripheral surface 15 and the peripheral edge portion 14 of the back surface of the wafer W. Thus, the peripheral surface 15 and the peripheral edge portion 14 of the back surface of the wafer W are cleaned.

After the back side cleaning operation is performed for a predetermined period to clean the peripheral surface 15 and the peripheral edge portion 14 of the back surface of the wafer W, the control section 67 controls the lift drive mechanism 19 to move up the brush 16 by a predetermined distance. By the upward movement of the brush 16, the brush 16 is located at a treatment position for a front side cleaning operation as shown in FIG. 9. Thus, the first cleaning surface 28 of the brush 16 is brought into contact with the wafer W, and depressed by the edge defined by the front surface and the peripheral surface 15 of the wafer W to a depression depth equivalent to the depth of the depression of the second cleaning surface 29 by the wafer W. As a result, the first cleaning surface 28 is kept in contact with the peripheral surface 15 and the peripheral edge portion 13 of the front surface of the wafer W (Step S5). At this time, an area of the peripheral edge portion 13 of the front surface of the wafer W in contact with the first cleaning surface 28 has a width which is equal to the cleaning width inputted from the recipe input key 70.

In this state, the wafer W and the brush 16 are rotated in the same direction, whereby the first cleaning surface 28 is kept in sliding contact with the peripheral surface 15 and the peripheral edge portion 13 of the front surface of the wafer W. Thus, the peripheral surface 15 and the peripheral edge portion 13 of the front surface of the wafer W are cleaned.

While the periphery of the wafer W is thus cleaned, contaminants are washed away from a center region (device formation region) of the front surface of the wafer W by the treatment liquid supplied to the front surface of the wafer W.

After the front side cleaning operation is performed for a predetermined period to clean the peripheral surface 15 and the peripheral edge portion 13 of the front surface of the wafer W, the control section 67 controls the pivot drive mechanism 18 and the lift drive mechanism 19 to retract the brush 16 to a home position at which the brush 16 is located before the start of the cleaning process (Step S6). When the brush 16 is moved back to the home position, the control section 67 turns off the brush motor 52 to stop the rotation of the brush 16. Further, the control section 67 closes the treatment liquid valve 12 to stop supplying the treatment liquid from the front side nozzle 4 and the back side nozzle 5 (Step S7).

Thereafter, the control section 67 controls the spin motor 9 to rotate the wafer W at a high speed (e.g., 3000 rpm) (Step S8). Thus, the treatment liquid adhering to the wafer W is spun off, whereby the wafer W is dried.

After the high-speed rotation of the wafer W is continued for a predetermined period, the spin motor 9 is stopped, whereby the spin chuck 3 stops rotating the wafer W (Step S9). After the wafer W comes to standstill, the cleaned wafer W is transported out of the treatment chamber 2 (Step S10).

Figure 10:
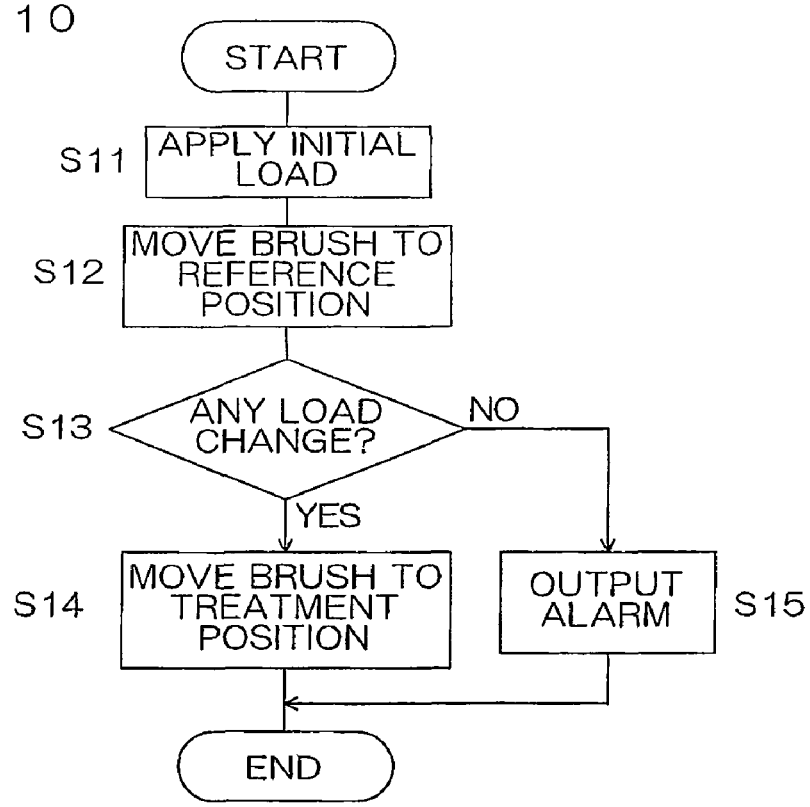
FIG. 10 is a flow chart showing a brush position judging operation to be performed in the cleaning process.

FIG. 10 is a flow chart showing a brush position judging operation to be performed in the cleaning process.

The brush position judging operation is performed by the control section 67 in the aforesaid cleaning process (at the initial stage of the back side cleaning operation). In the brush position judging operation, it is judged whether or not the brush 16 is properly located at the reference position.

At the beginning of the back side cleaning operation, the initial load is applied to the brush 16 (Step S11). After the brush 16 is moved for a preliminarily programmed movement distance toward the reference position from the home position (Step S12), the control section 67 acquires the level of a load vertically applied to the brush 16 with reference to an output of the pressure sensor 65.

With the brush 16 being located at the reference position, the second cleaning surface 29 of the brush 16 is depressed to the predetermined very small depth by the wafer W, so that the brush 16 receives a vertical counterforce from the back surface of the wafer W. Therefore, the load vertically applied to the brush 16 is changed by the movement of the brush 16.

Therefore, if the load vertically applied to the brush 16 is changed from the initial load by greater than a predetermined amount after the movement of the brush 16 to the reference position, the control section 67 judges that the brush 16 is properly located at the reference position (YES in Step S13). In this case, the brush 16 is subsequently moved to the treatment position from the reference position (Step S14).

On the other hand, if the load vertically applied to the brush 16 is not changed from the initial load by greater than the predetermined amount after the movement of the brush 16 to the reference position (NO in Step S13), the control section 67 judges that the brush 16 is not properly located at the reference position. In this case, an alarm is outputted to notify the operator of the improper positioning of the brush 16 (Step S15). After the alarm is outputted, the cleaning process may be immediately terminated, or the cleaning process may be continuously performed on the wafer W.

In the substrate treatment apparatus 1, whether or not the brush 16 is properly located at the reference position can be judged based on the output of the pressure sensor 65. This makes possible to detect the contact of the brush 16 with the periphery of the wafer W. Since the contact of the brush 16 with the periphery of the wafer W can be detected, the brush 16 is reliably kept in contact with the periphery of the wafer W and, in this state, the periphery of the wafer W is cleaned by the brush 16. Thus, the wafer periphery cleaning process is reliably performed.

Figure 11:
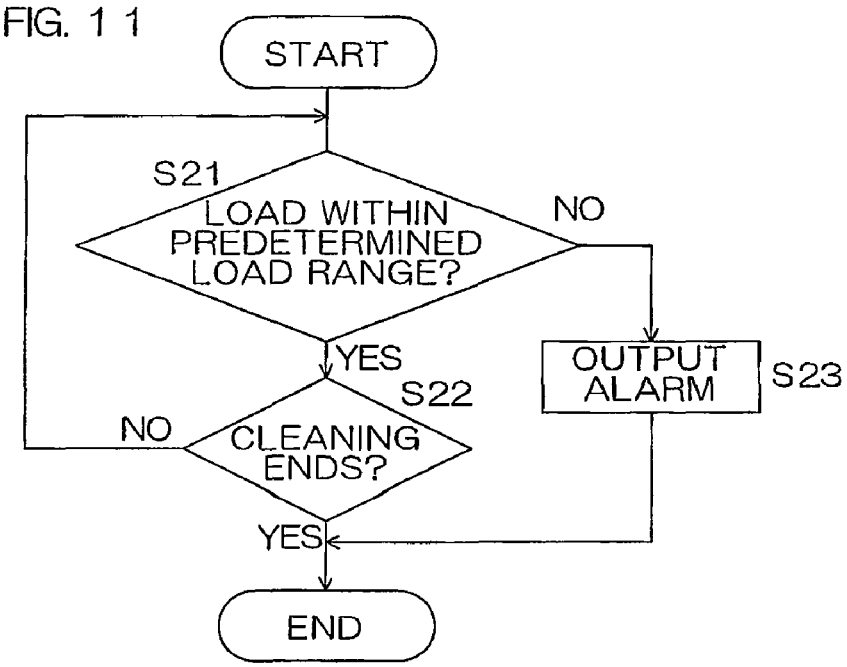
FIG. 11 is a flow chart showing a load monitoring operation to be performed in the cleaning process.

FIG. 11 is a flow chart showing a load monitoring operation to be performed during the cleaning process.

The load monitoring operation is performed by the control section 67 during the back side cleaning operation and the front side cleaning operation.

In the load monitoring operation, the level of the load vertically applied to the brush 16 is acquired with reference to the output of the pressure sensor 65. Then, whether or not the load is within a predetermined load range is judged (Step S21).

The load vertically applied to the brush 16 varies depending on the depth of the depression of the brush 16 by the wafer W. Where 2.0 mm is inputted as the desired cleaning width, for example, the brush 16 is moved 2.1 mm toward the center of the wafer W from the reference position according to the cleaning width/depression depth/load table shown in FIG. 5. At this time, the load change is 190 mN. Therefore, where the initial load is 800 mN and the inputted desired cleaning width is 2.0 mm, a load of 990 mN which is obtained by adding a load change of 190 mN to an initial load of 800 mN is theoretically applied to the brush 16 if the brush 16 is properly kept in contact with the wafer W in the back side cleaning operation. Further, a load of 610 mN which is obtained by subtracting a load change of 190 mN from an initial load of 800 mN is theoretically applied to the brush 16 if the brush 16 is properly kept in contact with the wafer W in the front side cleaning operation.

In the back side cleaning operation, the load range is determined based on a reference value obtained by adding the load change for the cleaning width to the initial load so as to have an upper limit and a lower limit determined, for example, by adding ±5% of the reference value to the reference value, and it is judged whether or not the load vertically applied to the brush 16 is within the load range thus determined. This judgment is repeatedly made until the back side cleaning operation ends (NO in Step S22).

If the back side cleaning operation ends without the vertical load to the brush 16 deviating from the predetermined load range (YES in Step S22), the load monitoring operation in the back side cleaning operation ends.

On the other hand, if the vertical load to the brush 16 deviates from the predetermined load range in the back side cleaning operation (NO in Step S21) the control section 67 judges that abnormal conditions such as eccentric rotation of the wafer W occur, and outputs an alarm (Step S23). After the alarm is outputted, for example, the back side cleaning operation may be immediately terminated, or the cleaning process may be continuously performed on the wafer W.

In the front side cleaning operation, the load range is determined based on a reference value obtained by subtracting the load change for the cleaning width from the initial load so as to have an upper limit and a lower limit determined, for example, by adding ±5% of the reference value to the reference value, and it is judged whether or not the load vertically applied to the brush 16 is within the load range thus determined. This judgment is repeatedly made until the front side cleaning operation ends (NO in Step S22).

If the front side cleaning operation ends without the vertical load to the brush 16 deviating from the predetermined load range (YES in Step S22), the load monitoring operation in the front side cleaning operation ends.

On the other hand, if the vertical load to the brush 16 deviates from the predetermined load range in the front side cleaning operation (NO in Step S21) the control section 67 judges that abnormal conditions such as eccentric rotation of the wafer W occur, and outputs an alarm (Step S23). After the alarm is outputted, for example, the front side cleaning operation may be immediately terminated, or the cleaning process may be continuously performed on the wafer W. Alternatively, a correction step may be performed instead of Step S23 without outputting the alarm. More specifically, the position of the brush 16 may be corrected to a proper position by feedback-controlling the pivot drive mechanism 18 and the lift drive mechanism 19 based on a detection signal from the pressure sensor 65 so that the load detected by the pressure sensor 65 falls within the predetermined load range. Thus, the brush 16 can be properly kept in contact with the periphery of the wafer W irrespective of the eccentric rotation of the wafer W and the warp and deformation of the wafer W.

If the load detected by the pressure sensor 65 is within the predetermined load range in the back side cleaning operation or in the front side cleaning operation, it is judged that the brush 16 is properly kept in contact with the wafer W (with a proper biasing pressure). On the other hand, if the load detected by the pressure sensor 65 is outside the predetermined load range, it is judged that the brush 16 does not properly contact the wafer W. If it is judged that the brush 16 does not properly contact the wafer W, the alarm is outputted, so that the operator can recognize the improper contact state of the brush 16.

In the substrate treatment apparatus 1, the cleaning width/depression depth/load table is stored in the memory 69. Therefore, when the operator inputs the desired cleaning width (the width of the area of the peripheral edge portion 13 of the front surface of the wafer W to be kept in contact with the brush 16) in the recipe, the depression depth for the inputted cleaning width is automatically acquired, and the movement of the brush 16 to the treatment position is controlled based on the depression depth thus acquired. As a result, the brush 16 can be brought in contact with an area of the peripheral edge portion 13 of the front surface of the wafer W having a width which is equal to the contact width inputted by the operator.

Since the first cleaning surface 28 and the second cleaning surface 29 of the brush 16 are each rotationally symmetrical about the vertically extending center axis, the brush 16 can be rotated about the center axis with the first and second cleaning surfaces 28, 29 kept in contact with the periphery of the wafer W. By thus rotating the brush 16, the periphery of the wafer W is scrubbed. As a result, the periphery of the wafer W can be further advantageously cleaned.

Further, it is possible to keep the first cleaning surface 28 in contact with the peripheral surface 15 and the peripheral edge portion 13 of the front surface of the wafer W and to keep the second cleaning surface 29 in contact with the peripheral surface 15 and the peripheral edge portion 14 of the back surface of the wafer W. Thus, the peripheral surface 15 and the peripheral edge portions 13, 14 of the front and back surfaces of the wafer W can be scrubbed with the single brush 16.

Figure 12:
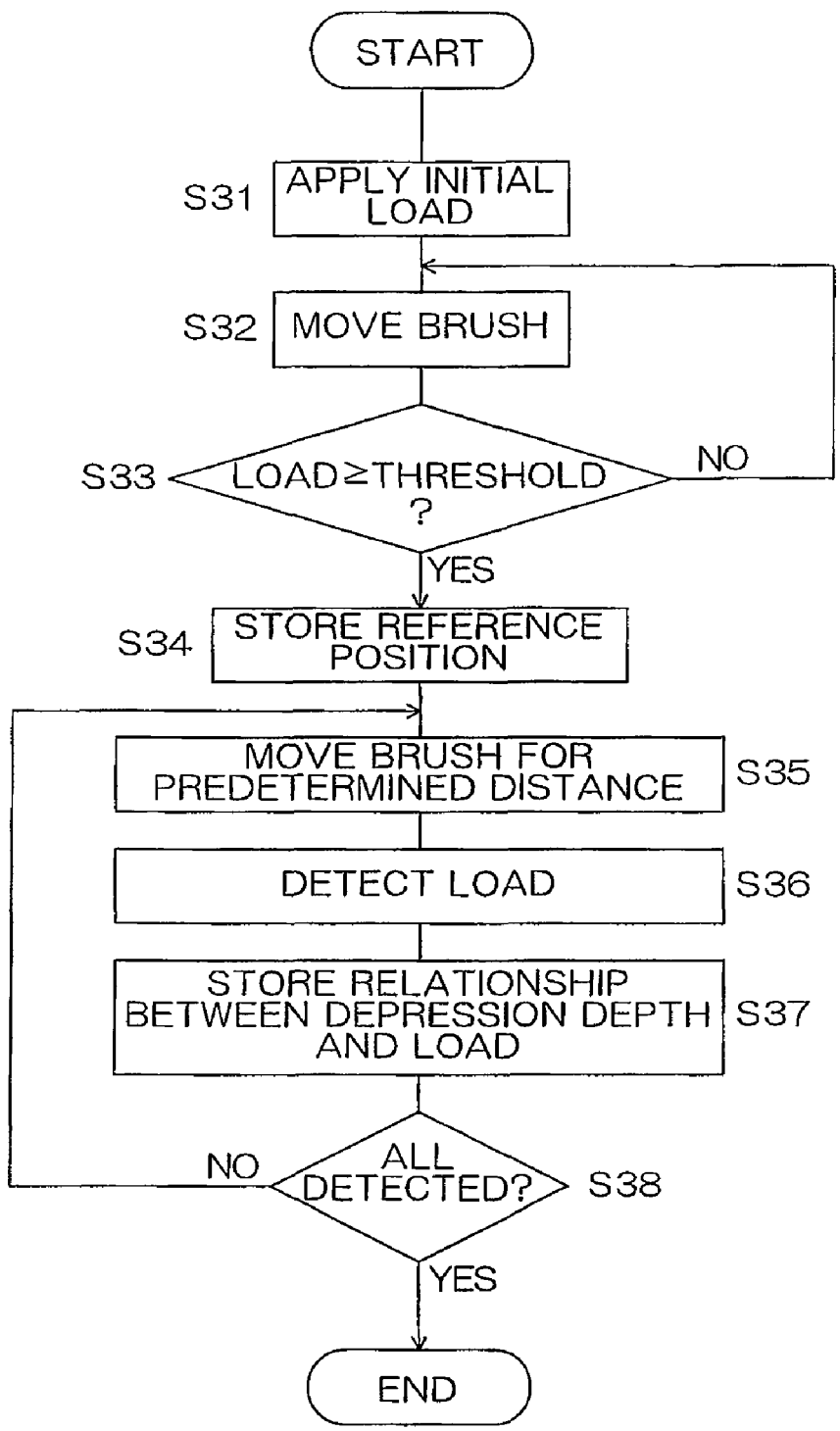
FIG. 12 is a flow chart showing a teaching process.

It is noted that the setting of the reference position and the preparation of a part of the cleaning width/depression depth/load table may be automatically carried out through a teaching process as shown in FIG. 12.

FIG. 12 is a flow chart showing the teaching process.

In the teaching process, a dummy wafer having the same shape as the wafer W, for example, is held on the spin chuck 3. Of course, the wafer W to be cleaned may be held instead of the dummy wafer on the spin chuck 3. Here, the teaching process employing the dummy wafer will be explained by way of example.

After the initial load is applied to the brush 16 (Step S31), the brush 16 is moved toward the dummy wafer from the home position (Step S32). More specifically, the height of the brush 16 is adjusted, and the brush 16 is horizontally moved toward the dummy wafer at this height so that the second cleaning surface 29 contacts the back surface and the peripheral surface of the dummy wafer.

During the movement of the brush 16, the control section 67 constantly monitors the load vertically applied to the brush 16 with reference to the output of the pressure sensor 65. Then, it is repeatedly checked whether or not the load vertically applied to the brush 16 is greater than a predetermined threshold (Step S33). With the brush 16 in contact with the dummy wafer, the brush 16 receives a counterforce from the back surface of the dummy wafer, so that the load vertically applied to the brush 16 is changed. The threshold is determined based on a load change occurring due to the contact of the brush 16 with the dummy wafer (for example, the threshold is set at a level obtained by adding the load change to the initial load). Therefore, the judgment on whether or not the brush 16 contacts the dummy wafer can be based on whether or not the load vertically applied to the brush 16 is greater than the threshold.

If the load vertically applied to the brush 16 is greater than the threshold (YES in Step S33), the reference position is set at a position at which the brush 16 is present at this time, and this reference position is stored in the memory 69 (Step S34). Thus, the reference position is set at a position such that the second cleaning surface 29 is depressed to a predetermined depression depth by the edge defined by the peripheral surface and the back surface of the dummy wafer (wafer W) held by the spin chuck 3. Thus, the automatic setting of the reference position is achieved.

Thereafter, the brush 16 is moved for a predetermined distance toward the center of the dummy wafer from the reference position (Step S35). Then, the load vertically applied to the brush 16 is detected after the movement (Step S36), and the detected load is stored in the memory 69 in correlation with a depression depth which is equivalent to the distance of the movement of the brush 16 from the reference position (Step S37). A sequence of Steps S35 to S37 is repeated until load levels for all depression depths contained in the cleaning width/depression depth/load table are obtained (NO in Step S38). If the load levels for all the depression depths are acquired (YES in Step S38), a relationship between the depression depth and the load to be stored in the cleaning width/depression depth/load table is automatically determined.

In order to move the brush 16 to the treatment position, the reference position serving as a reference for the movement should be preliminarily taught to the control section 67. It is a conventional practice that the operator manually performs a teaching process. That is, the operator visually checks if the brush 16 contacts the peripheral surface of the dummy wafer, while gradually moving the brush 16. Then, a position at which the brush 16 is present when the operator confirms the contact of the brush 16 with the peripheral surface of the dummy wafer is inputted to the control section 67, and employed as the reference position for guiding the brush 16 to the treatment position. However, the reference position thus set by the conventional teaching process varies depending on the experience and expertise of the operator, and the treatment position is correspondingly offset.

In the teaching process according to the present invention, the brush 16 is moved toward the dummy wafer held by the spin chuck 3, and the reference position is set at a position at which the brush 16 is present when a load detected by the pressure sensor 65 exceeds the predetermined threshold due to the contact of the brush 16 with the dummy wafer. Thus, the reference position can be set at such a unique position irrespective of the experience and expertise of the operator unlike in the conventional reference position setting method.

Further, the brush 16 is located at different treatment positions, and the levels of the load applied to the brush 16 when the brush 16 is located at the respective treatment positions are detected. The load levels thus detected are automatically stored in the memory 69 (the cleaning width/depression depth/load table) in correlation with the distances between the reference position and the respective treatment positions (depression depths). Therefore, the operator is saved from having to manually input the relationship among the cleaning width, the depression depth and the load.

It is noted that the shape of the brush 16 is not limited to that shown in FIG. 3, but the brush 16 may have any of various shapes.

Figure 13:
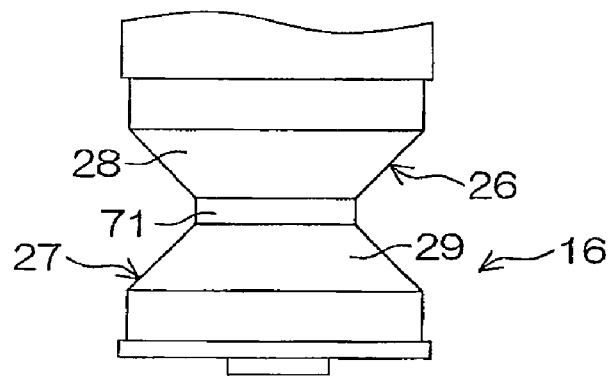
FIG. 13 is a side view illustrating a first modification of the brush.

As shown in FIG. 13, for example, the brush 16 may be shaped such as to further include a cylindrical connection portion 71 integrally provided between the first cleaning portion 26 and the second cleaning portion 27. Where the brush 16 having such a shape is employed, the reference position may be set at a position such that the peripheral surface of the wafer W contacts a peripheral surface of the connection portion 71. This reference position may be automatically set by moving up and down the brush 16 in the vicinity of the periphery of the wafer W to bring the periphery of the wafer W into contact with the first cleaning surface 28 and the second cleaning surface 29 alternately while moving the brush 16 toward the wafer W, and storing in the memory 69 a position at which the brush 16 is present when the load vertically applied to the brush 16 is equal to the initial load.

Figure 14:
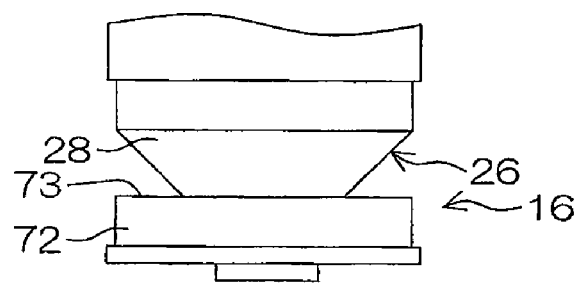
FIG. 14 is a side view illustrating a second modification of the brush.

Further, as shown in FIG. 14, the brush 16 may be shaped such as to include a flat and cylindrical second cleaning portion 72 instead of the second cleaning portion 27 shown in FIG. 3. In this case, the first cleaning surface 28 is brought into contact with the peripheral surface and the peripheral edge portion 13 of the front surface of the wafer W, and a peripheral edge portion 73 of an upper surface of the second cleaning portion 72 is brought into contact with the peripheral edge portion 14 of the back surface of the wafer W. This makes it possible to clean an area of the peripheral edge portion 13 of the front surface of the wafer W having a cleaning width exactly corresponding to the depth of the depression of the brush 16 by the wafer W, while cleaning the peripheral edge portion 14 of the back surface of the wafer W.

Figure 15:
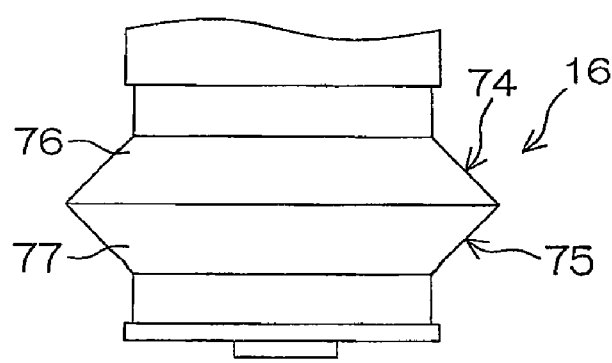
FIG. 15 is a side view illustrating a third modification of the brush.

Further, as shown in FIG. 15, the brush 16 may be shaped such as to include a first cleaning portion 74 having a generally truncated cone shape expanded downward and a second cleaning portion 75 having a generally truncated cone shape tapered downward. A side surface 76 of the first cleaning portion 74 is inclined downward away from the center axis at an inclination angle of 45 degrees with respect to the vertical axis. On the other hand, a side surface 77 of the second cleaning portion 75 has an upper edge continuous to a lower edge of the side surface 76, and is inclined downward toward the center axis at an inclination angle of 45 degrees with respect to the vertical axis. The side surface 76 of the first cleaning portion 74 of the brush 16 serves as a cleaning surface for cleaning the peripheral surface 15 and the peripheral edge portion 14 of the back surface of the wafer W, and the side surface 77 of the second cleaning portion 75 serves as a cleaning surface for cleaning the peripheral surface 15 and the peripheral edge portion 13 of the front surface of the wafer W.

Figure 16:
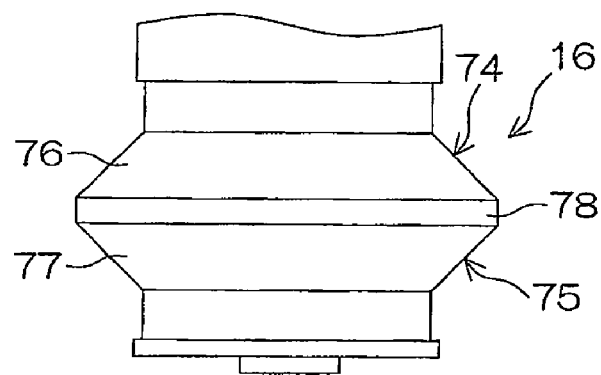
FIG. 16 is a side view illustrating a fourth modification of the brush.

Further, as shown in FIG. 16, the blush 16 may be shaped such as to include a cylindrical connection portion 78 integrally provided between the first cleaning portion 74 and the second cleaning portion 75. Where the brush 16 having such a shape is employed, the reference position may be set at a position such that the peripheral surface of the wafer W contacts a peripheral surface of the connection portion 78.

Figure 17:
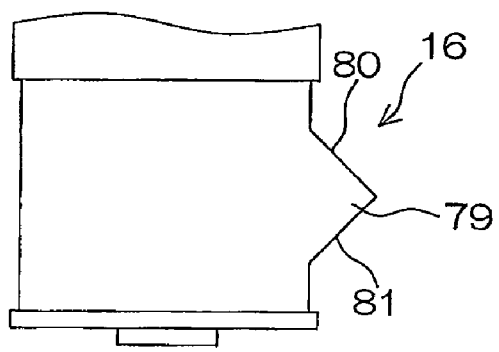
FIG. 17 is a side view illustrating a fifth modification of the brush.

Further, the brush 16 is not necessarily required to be rotatable. Where the brush 16 is not rotatable, the brush 16 may be shaped as shown in FIG. 17. The brush 16 shown in FIG. 17 has a triangular projection 79 projecting horizontally as seen from a lateral side. The projection 79 is elongated perpendicularly to the paper face of FIG. 17, and has an upper surface 80 and a lower surface 81 each inclined at an inclination angle of 45 degrees with respect to the vertical axis. The upper surface 80 of the projection 79 of the brush 16 serves as a cleaning surface for cleaning the peripheral surface 15 and the peripheral edge portion 14 of the back surface of the wafer W, and the lower surface 81 of the projection 79 serves as a cleaning surface for cleaning the peripheral surface 15 and the peripheral edge portion 13 of the front surface of the wafer W.

Figure 18:
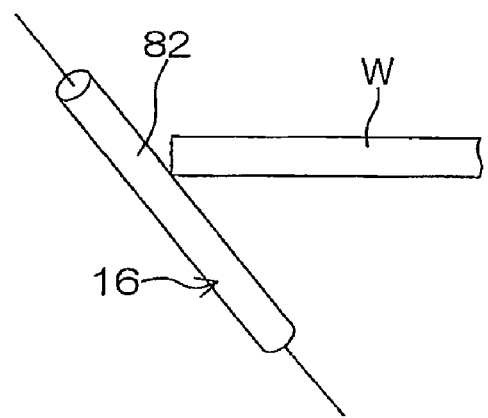
FIG. 18 is a side view illustrating a sixth modification of the brush.

Further, as shown in FIG. 18, a cylindrical brush with its circumferential surface serving as a cleaning surface may be employed as the brush 16. In this case, the brush 16 is disposed with its center axis being inclined with respect to the vertical axis, and the circumferential surface of the brush 16 is brought into contact with the peripheral surface 15 and the peripheral edge portion 13 of the front surface of the wafer W, whereby the peripheral surface 15 and the peripheral edge portion 13 of the front surface of the wafer W is cleaned. Further, the circumferential surface of the brush 16 is brought into contact with the peripheral surface 15 and the peripheral edge portion 14 of the back surface of the wafer W, whereby the peripheral surface 15 and the peripheral edge portion 14 of the back surface of the wafer W is cleaned.

While the embodiments of the present invention have thus been described in detail, it should be understood that these embodiments are merely illustrative of the technical principles of the present invention but not limitative of the invention. The spirit and scope of the present invention are to be limited only by the appended claims.

The substrate treatment apparatus may be configured, for example, to detect the abrasion of the brush 16 based on the load applied to the brush 16 during the cleaning process and automatically change the position (treatment position) of the brush 16 to properly keep the brush 16 in contact with the wafer W (with a proper biasing pressure) regardless of the abrasion of the brush 16. The brush 16, even if being located at the same treatment position, contacts the wafer W in different contact states, for example, when the brush 16 is abraded and when the brush 16 is not abraded. Accordingly, the contact width of the brush 16 with respect to the front or back surface of the wafer W varies. Therefore, the substrate treatment apparatus may be configured such as to detect the load vertically applied to the brush 16 at the treatment position after every predetermined number of wafers W (one or more wafers W) are treated, and automatically change the treatment position so that the detected load is equal to a load suitable for the treatment position.

This application corresponds to Japanese Patent Application No. 2007-120078 filed in the Japanese Patent Office on Apr. 27, 2007, the disclosure of which is incorporated herein by reference in its entirety.

What is claimed is:

1. A substrate treatment apparatus for performing a substrate periphery cleaning process, the substrate treatment apparatus comprising:
   a substrate holding mechanism which holds a substrate;
   a brush having a cleaning surface inclined with respect to a first axis extending perpendicularly to a front surface of the substrate held by the substrate holding mechanism;
   a brush moving mechanism which moves the brush along the first axis and along a second axis orthogonal to the first axis;
   a load detecting unit which detects a load applied along the first axis to the brush; and
   a first judging unit which judges, based on an output of the load detecting unit, whether or not the brush is located at a reference position serving as a reference for guiding the brush to a treatment position at which the brush is located in the cleaning process;
   wherein the reference position is a position such that the cleaning surface is depressed to a predetermined depth by an edge defined by a peripheral surface and one of the front surface and a back surface of the substrate held by the substrate holding mechanism when the brush is located at the reference position; and
   further comprising:
   an initial load applying mechanism which applies a predetermined load to the brush with the brush being in non-contact with the substrate held by the substrate holding mechanism, wherein
   the first judging unit judges, on the basis of a change in the load detected by the load detecting unit from the initial load, whether the brush is located at the reference position.

2. The substrate treatment apparatus according to claim 1, further comprising:
   a second judging unit, which judges whether or not the load detected by the load detecting unit is within a predetermined load range when the brush is located at the treatment position.

3. The substrate treatment apparatus according to claim 1, further comprising:
   a reference position setting unit which controls the brush moving mechanism to move the brush toward the substrate held by the substrate holding mechanism while monitoring the output of the load detecting unit, and sets the reference position at a position at which the brush is present when the load detected by the load detecting unit exceeds a predetermined threshold due to contact of the brush with the substrate.

4. The substrate treatment apparatus according to claim 3, further comprising:
   a load storage which stores a load applied along the first axis to the brush when the brush is located at the treatment position; and
   a storage controlling unit which controls the brush moving mechanism to move the brush from the reference position to the treatment position and stores a load detected by the load detecting unit when the brush is located at the treatment position in correlation with a distance between the reference position and the treatment position in the load storage.

5. The substrate treatment apparatus according to claim 1, wherein the treatment position includes a plurality of treatment positions which are spaced different distances from the reference position, the substrate treatment apparatus further comprising:

a contact width storage which stores contact widths of the brush with respect to the front surface of the substrate observed when the brush is located at the respective treatment positions in correlation with distances between the reference position and the respective treatment positions.

6. The substrate treatment apparatus according to claim 1, wherein the cleaning surface has a shape rotationally symmetrical about a center axis extending along the first axis.

7. The substrate treatment apparatus according to claim 6, wherein the cleaning surface includes a first portion having a shape tapered in one direction along the first axis toward one edge thereof, and a second portion having a shape flared from the one edge of the first portion in the one direction along the first axis.

* * * * *